United States Patent
Raghunathan et al.

(10) Patent No.: US 9,418,000 B2
(45) Date of Patent: Aug. 16, 2016

(54) DYNAMICALLY COMPENSATING FOR DEGRADATION OF A NON-VOLATILE MEMORY DEVICE

(71) Applicant: Intel Corporation, Santa Clara, CA (US)

(72) Inventors: Shyam Sunder Raghunathan, Sunnyvale, CA (US); Iwen Chao, Sacramento, CA (US); Xin Guo, San Jose, CA (US); Pranav Kalavade, San Jose, CA (US); Krishna K. Parat, Palo Alto, CA (US); Feng Zhu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/579,971

(22) Filed: Dec. 22, 2014

(65) Prior Publication Data
US 2016/0180958 A1 Jun. 23, 2016

(51) Int. Cl.
| | | |
|---|---|---|
| *G11C 16/04* | (2006.01) | |
| *G06F 12/02* | (2006.01) | |
| *G11C 16/34* | (2006.01) | |
| *G11C 16/14* | (2006.01) | |
| *G11C 16/26* | (2006.01) | |
| *G11C 16/32* | (2006.01) | |
| *G06F 11/10* | (2006.01) | |
| *G11C 16/10* | (2006.01) | |

(52) U.S. Cl.
CPC ........ *G06F 12/0246* (2013.01); *G06F 11/1084* (2013.01); *G11C 16/14* (2013.01); *G11C 16/26* (2013.01); *G11C 16/32* (2013.01); *G11C 16/3495* (2013.01); *G06F 2212/7211* (2013.01); *G11C 16/10* (2013.01); *G11C 16/349* (2013.01)

(58) Field of Classification Search
CPC ............ G06F 12/0246; G06F 11/1008; G06F 13/1694; G06F 2212/7209; G11C 16/10; G11C 11/5628; G11C 7/1063; G11C 29/82; G11C 29/765
USPC ............. 365/185.24, 185.29, 185.18, 185.03, 365/185.09; 711/103, 154, 156, E12.008
See application file for complete search history.

(56) References Cited

U.S. PATENT DOCUMENTS

| | | | |
|---|---|---|---|
| 7,920,419 B2 | 4/2011 | Damle et al. | |
| 7,989,289 B2 | 8/2011 | Krishnamohan et al. | |
| 8,130,553 B2 * | 3/2012 | Buch ...................... | G11C 16/10 365/185.03 |
| 8,542,531 B2 | 9/2013 | Franklin et al. | |
| 8,624,300 B2 | 1/2014 | Tang et al. | |

(Continued)

FOREIGN PATENT DOCUMENTS

| | | |
|---|---|---|
| CN | 104321822 A | 1/2015 |
| WO | WO 2010/121902 A1 | 10/2010 |
| WO | 2013191898 A1 | 12/2013 |

*Primary Examiner* — David Lam
(74) *Attorney, Agent, or Firm* — Thorpe North & Western, LLP

(57) ABSTRACT

Apparatus, systems, and methods to implement dynamic memory management in nonvolatile memory devices are described. In one example, a controller comprises logic to monitor at least one performance parameter of a nonvolatile memory, determine when the at least one performance parameter passes a threshold which indicates a degradation in performance for the nonvolatile memory, and in response to the at least one performance parameter passing the threshold, to modify at least one operational attribute of the nonvolatile memory. Other examples are also disclosed and claimed.

21 Claims, 9 Drawing Sheets

(56) References Cited

U.S. PATENT DOCUMENTS

| | | |
|---|---|---|
| 8,792,283 B2 | 7/2014 | Wakchaure et al. |
| 8,929,151 B2 | 1/2015 | Wakchaure et al. |
| 8,943,385 B2 | 1/2015 | Motwani et al. |
| 9,030,885 B2 | 5/2015 | Wakchaure et al. |
| 9,099,183 B2 | 8/2015 | Srinivasan et al. |
| 2007/0180328 A1 | 8/2007 | Cornwell et al. |
| 2009/0244979 A1 | 10/2009 | Mihnea et al. |
| 2012/0163074 A1 | 6/2012 | Franca-Neto et al. |
| 2013/0173844 A1* | 7/2013 | Chen .............. G06F 12/0246 711/103 |
| 2014/0164872 A1 | 6/2014 | Frickey et al. |
| 2014/0169093 A1 | 6/2014 | Parat et al. |
| 2014/0173174 A1 | 6/2014 | Frickey et al. |
| 2014/0269090 A1 | 9/2014 | Flynn et al. |
| 2015/0213900 A1 | 7/2015 | Wakchaure et al. |

* cited by examiner

DYNAMICALLY COMPENSATING FOR DEGRADATION OF A NON-VOLATILE MEMORY DEVICE

FIELD

The present disclosure generally relates to the field of electronics. More particularly, aspects generally relate to degradation of nonvolatile memory devices.

BACKGROUND

Solid state drives (SSD) or nonvolatile direct in-line memory modules (NV-DIMMS) provide high speed, nonvolatile memory capacity without the need for moving parts. SSDs commonly comprise a nonvolatile memory (e.g., NAND flash memory) and a local controller, and may be coupled to a memory system of an electronic device. Performance characteristics of nonvolatile memory devices, and particularly program/erase performance, tend to degrade over time as the number of program/erase cycles driven through a memory device increases. Accordingly, techniques to manage nonvolatile memory devices may find utility, e.g., in memory systems for electronic devices.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

Figure 1:
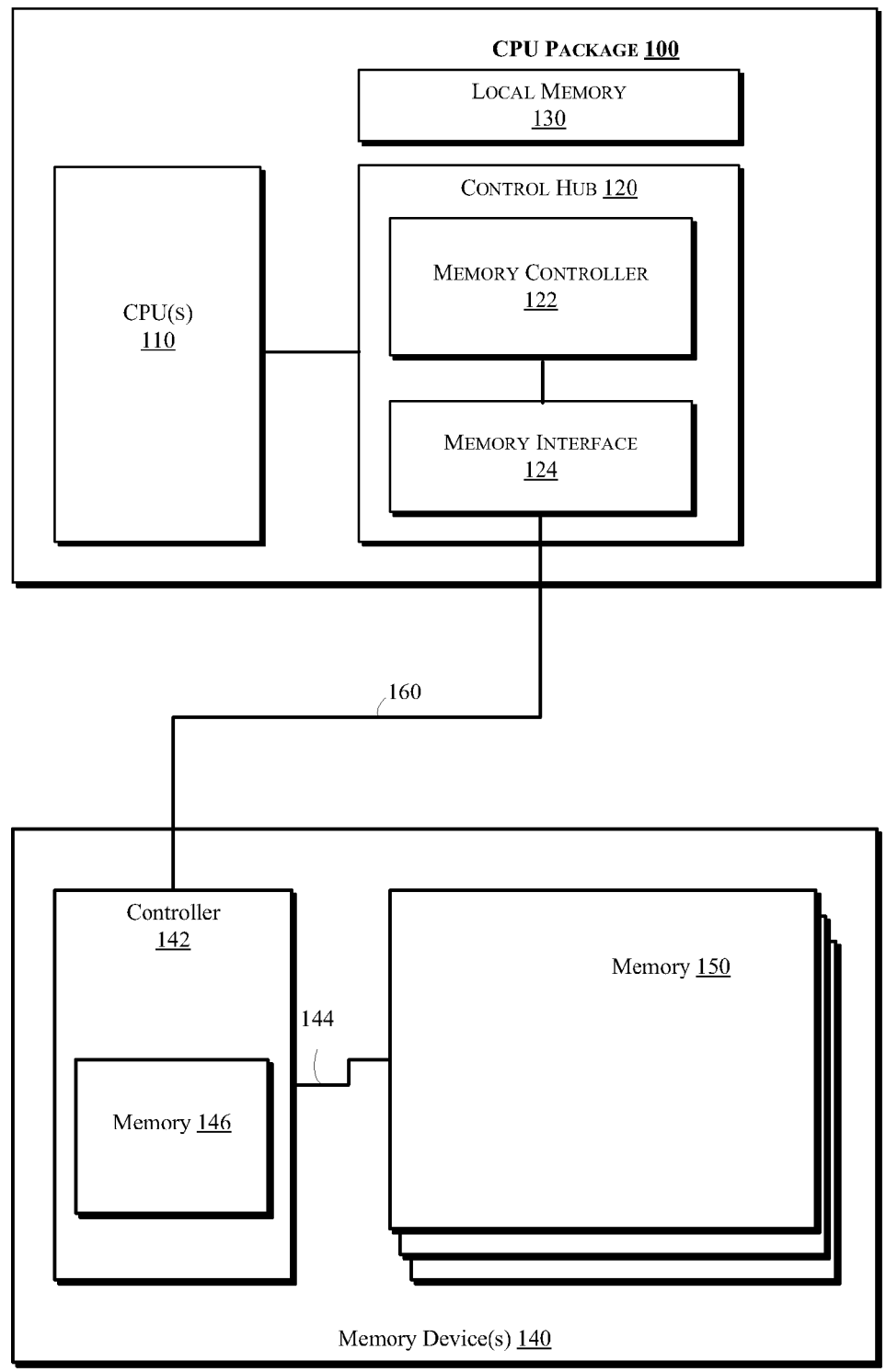
FIG. 1 is a schematic, block diagram illustration of components of an apparatus in which management of degradation of nonvolatile memory devices may be implemented in accordance with various examples discussed herein.

In the following description, numerous specific details are set forth in order to provide a thorough understanding of various examples. However, various examples may be practiced without the specific details. In other instances, wellknown methods, procedures, components, and circuits have not been described in detail so as not to obscure the particular examples. Further, various aspects of examples may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

As described above, performance characteristics of nonvolatile memory devices, and particularly program/erase performance, tend to degrade over time as the number of program/erase cycles performed in a memory device increases. This degradation is due, at least in part, to electrons becoming trapped in semiconductor material which comprises the nonvolatile memory device, the presence of which changes the quiescent voltage of the semiconductor material. More particularly, as number of program/erase cycles increases, electrons get trapped up in the memory device. As a result, the quiescent threshold voltage of the memory device increases. Semiconductor materials are designed with a target program threshold voltage (Vtp) and target erase threshold voltage (Vte) (which are illustrated as Vtp and Vte, respectively in FIG. 3A). In some materials there may be multiple target program threshold voltages corresponding to various levels in a multi-level memory, e.g. a multi-level cell (MLC) flash memory.) There is a certain 'saturated erase threshold voltage', which is the lowest erase threshold voltage that can be achieved. As the quiescent threshold voltage of the non-volatile memory device increases, the saturated erase threshold voltage also increases. Thus, it becomes increasingly difficult to erase the memory when the quiescent threshold voltage of the memory device increases. Once the saturated erase threshold voltage increases sufficiently above the target erase threshold voltage, erase can no longer be achieved, which is considered an 'erase fail' or 'endurance fail'.

As described in detail below, by moving the target erase threshold voltage progressively higher, a non-volatile memory device can withstand an increased number of P/E cycles before the saturated erase threshold voltage crosses the target erase threshold voltage, greatly improving the erase endurance. In order to address such performance degradation issues, in one example there is provided a controller comprising logic, at least partially including hardware logic, to monitor at least one performance parameter of a nonvolatile memory, determine when the at least one performance parameter passes a threshold which indicates a degradation in performance for the nonvolatile memory, and in response to the at least one performance parameter passing the threshold, to modify at least one operational attribute of the nonvolatile memory. In further examples the controller may be incorporated into a storage device, e.g., a solid state drive (SSD) or a NV-DIMM, which in turn may be incorporated into an electronic device, e.g., a computer, laptop, smartphone, electronic reader, or the like.

FIG. 1 is a schematic, block diagram illustration of components of an apparatus in which methods to manage nonvolatile memory devices may be implemented in accordance with various examples discussed herein. Referring to FIG. 1, in some examples a central processing unit (CPU) package 100 which may comprise one or more CPUs 110 coupled to a control hub 120 and a local memory 130. Control hub 120 comprises a memory controller 122 and a memory interface 124. In some examples the control hub 120 may be integrated with the processor(s) 110.

Memory interface 124 is coupled to one or more remote memory devices 140 by a communication bus 160. Storage device 140 may be implemented as a solid state drive (SSD), a nonvolatile direct in-line memory module (NV-DIMM) or the like and comprise a controller 142 which may comprise local memory 146, and memory 150. In various examples, at least some of the memory 150 may comprise nonvolatile memory, e.g., phase change memory, NAND (flash) memory, ferroelectric random-access memory (FeTRAM), nanowirebased non-volatile memory, memory that incorporates memristor technology, a static random access memory (SRAM), three dimensional (3D) cross point memory such as phase change memory (PCM), spin-transfer torque memory (STT-RAM) or NAND memory. The specific configuration of the memory 150 in the memory device(s) 140 is not critical. In such embodiments the memory interface may comprise a Serial ATA interface, a PCI Express (PCIE) to 100 interface, or the like.

Figure 2:
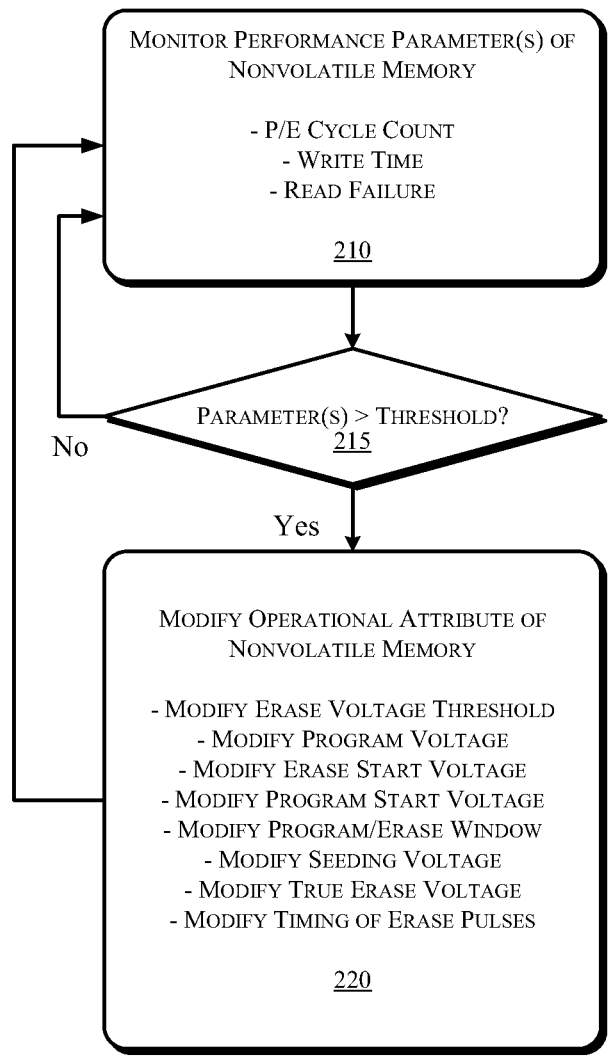
FIG. 2 is a flowchart illustrating high-level operations in methods to implement dynamic management of nonvolatile memory devices in accordance with various examples discussed herein.

Operations implemented by controller 142 will be described with reference to FIGS. 2 and 3-5. Referring first to FIG. 2, at operation 210 the controller 142 monitors one or more performance parameters of the nonvolatile memory 150. In some examples the controller 142 may monitor a number of program/erase cycles executed on the nonvolatile memory 150. Performance degradation may be correlated with program/erase cycle counts during a testing process and therefore the program/erase cycle count may function as a proxy for direct measures of performance degradation. In other examples the controller 142 may monitor performance parameters such as write time (i.e., an amount of time required to complete a write operation to the nonvolatile memory 150) or a number of read failures within a predetermined window of time. Similarly, write times and read failures may correlated with program/erase cycle counts during a testing process and therefore the program/erase cycle count may function as a proxy for direct measures of performance degradation.

Referring to FIG. 2, if, at operation 215, the performance parameter(s) monitored in operation 210 fail to exceed a threshold then control passes back to operation 210 and the controller 142 continues to monitor the performance parameter(s) while operation of the memory 150 continues. By contrast, if at operation 215 the performance parameter(s) monitored in operation 210 meet or exceed the threshold then control passes to operation 220 and the controller 142 modifies one or more operational attributes of the nonvolatile memory 150. Control then passes back to operation 210 and the controller 142 continues to monitor the performance parameter(s) while operation of the memory 150 continues.

Figure 3A:
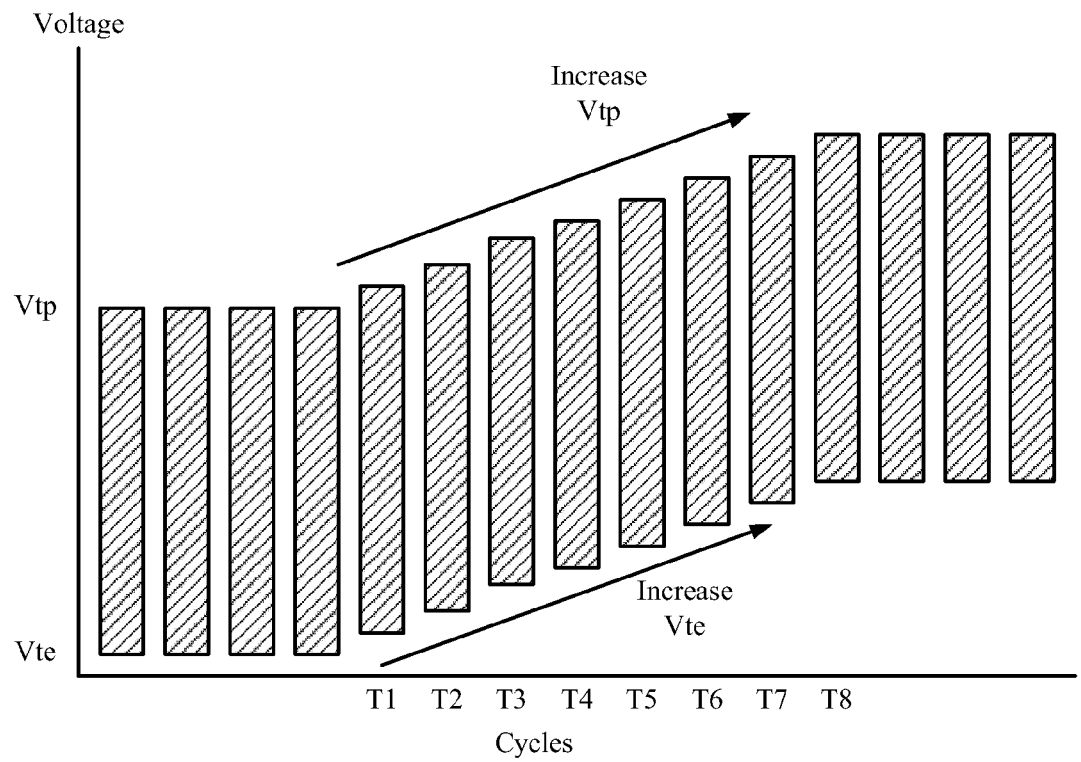
FIGS. 3A-3B are schematic illustrations of operations in methods to implement dynamic memory management in nonvolatile memory devices in accordance with various examples discussed herein.

Various modifications to operational parameters are described with reference to FIGS. 3A-3B and FIGS. 4-5. Referring first to FIG. 3A, in some examples the controller 142 increases a program voltage threshold and an erase voltage threshold of the nonvolatile memory 150 progressively as the number of program/erase cycles executed on the nonvolatile memory increases. As can be seen in FIG. 3A, in an initial condition the nonvolatile media is configured to have an erase voltage threshold (Vte) and a program voltage threshold (Vtp) which define what is sometimes referred to as a program/erase (P/E) window indicated by the vertical bars in FIG. 3A. In operation, the controller 142 monitors the P/E cycle count executed on the nonvolatile memory 150 and leaves the erase voltage threshold (Vte) and the program voltage threshold (Vtp) constant until the cycle count reaches a first threshold T1 (e.g., 1000 cycles), whereupon the controller 142 begins a process of incrementally increasing the erase voltage threshold (Vte) and the program voltage threshold (Vtp) as the P/E cycle count hits successive thresholds (e.g., T2, T3, T4, T5, T6, T7). In some examples the voltage thresholds are raised slowly (e.g., every 100 P/E cycles) in relatively small increments (e.g., 0.025 volts), and in a manner that keeps the size of the P/E window constant over time. Further, in some examples the controller 142 may leave the erase voltage threshold (Vte) and the program voltage threshold (Vtp) constant once the cycle count reaches a final threshold T8 (e.g., 6000 cycles). This algorithm ensures that the nonvolatile memory 150 maintains strong data retention at low cycle counts while maintaining strong cycling endurance at high cycle counts.

Figure 3B:
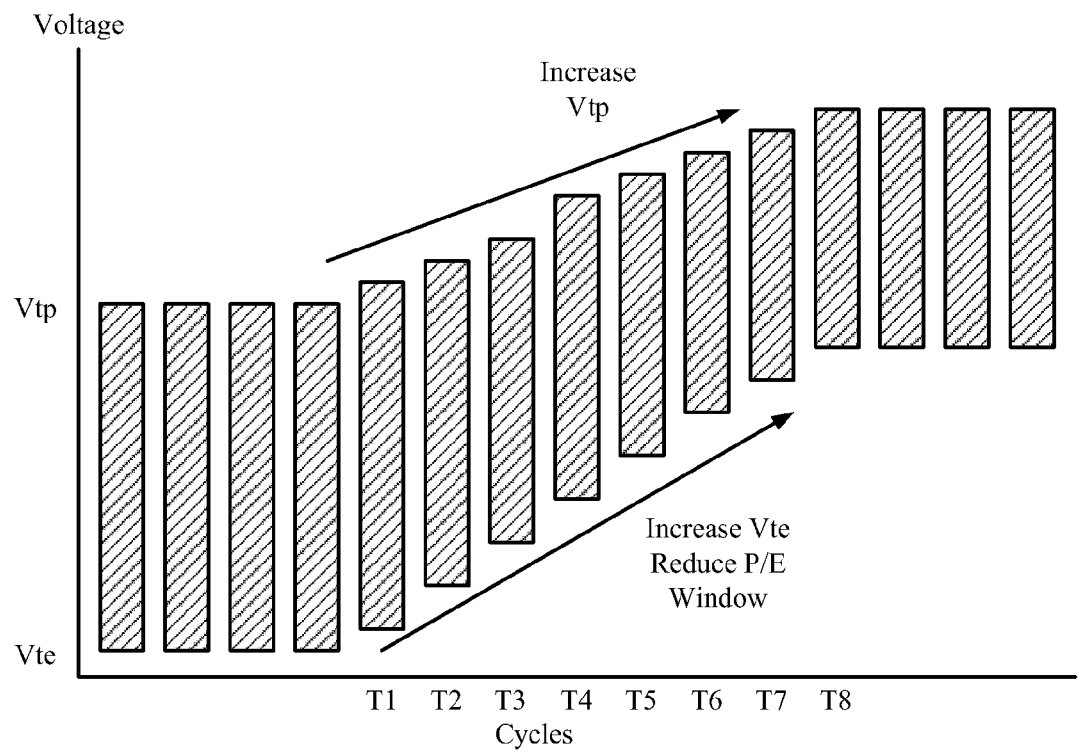

In another example depicted in FIG. 3B the controller 142 adjusts the erase voltage threshold (Vte) and the program voltage threshold (Vtp) as performed in FIG. 3A, but changes the erase voltage threshold (Vte) in increments that are larger than the increments of change applied to the program voltage threshold (Vtp) such that the size of the P/E window is reduced as the cycle count increases. Like the algorithm in FIG. 3A, this algorithm ensures that the nonvolatile memory 150 maintains strong data retention at low cycle counts while maintaining strong cycling endurance at high cycle counts. In addition, reducing the size of the P/E window serves to reduce the rate of degradation of the memory device with cycles (because there is lesser amount charge moving each cycle)

In further examples the controller 142 adjusts starting voltages applied during program and erase operations to compensate for performance degradation in the nonvolatile memory. For a given target erase threshold voltage, the final erase voltage (i.e., gate-voltage) gets determined based on the gate-voltage needed to meet the target erase threshold voltage. That determination is based on the memory device and the on-die state-machine. As the quiescent voltage increases, the final erase voltage will automatically increase to compensate. Therefore, for a given starting erase voltage, the time taken to reach the final erase voltage increases with cycles. The controller can compensate for this by increasing the starting erase voltage based on the number of P/E cycles, which can keep the erase performance (i.e., the time taken for erase operation) approximately constant through cycles.

Figure 4:
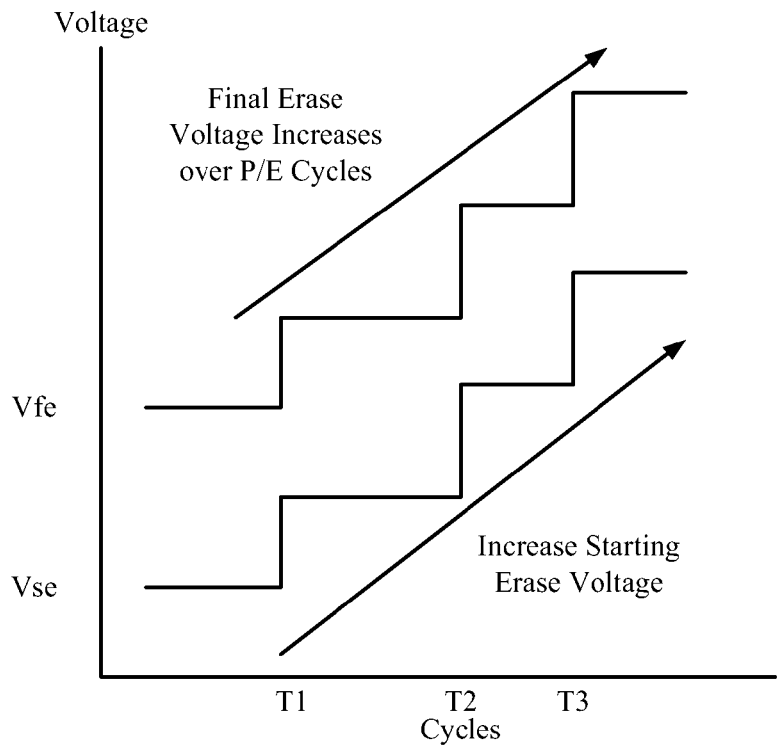
FIGS. 4-5 are schematic illustrations of operations in methods to implement dynamic memory management in nonvolatile memory devices in accordance with various examples discussed herein.

Referring to FIG. 4, in some examples as the final erase voltage increases over time (or more accurately over P/E cycles) the controller 142 increases the starting erase voltage applied during an erase operation progressively as the number of program/erase cycles executed on the nonvolatile memory increases. Thus, in an initial condition the nonvolatile media has an initial starting point for the final erase voltage (Vfe). As the number of P/E cycles increases the final erase voltage is increased, as described above. Similarly, in an initial condition the nonvolatile media is configured to have an start erase voltage (Vse). In operation, the controller 142 monitors the P/E cycle count executed on the nonvolatile memory 150 and leaves the start erase voltage (Vse) constant until the cycle count reaches a first threshold T1 (e.g., 1000 cycles), whereupon the controller 142 begins a process of incrementally increasing the start erase voltage (Vse) as the P/E cycle count hits successive thresholds (e.g., T2, T3). In some examples the final erase voltage (Vfe) and the start erase voltage (Vse) are raised contemporaneously so as to maintain a substantially constant difference between the final erase voltage (Vfe) and the start erase voltage (Vse).

In some examples an analogous principle may be applied to the program voltage. As the quiescent voltage increases, the final program voltage will automatically decrease to compensate. The controller can compensate for the reduction in the final program voltage by decreasing the starting program voltage based on the number of P/E cycles, which can keep the program performance approximately constant through cycles.

Figure 5:
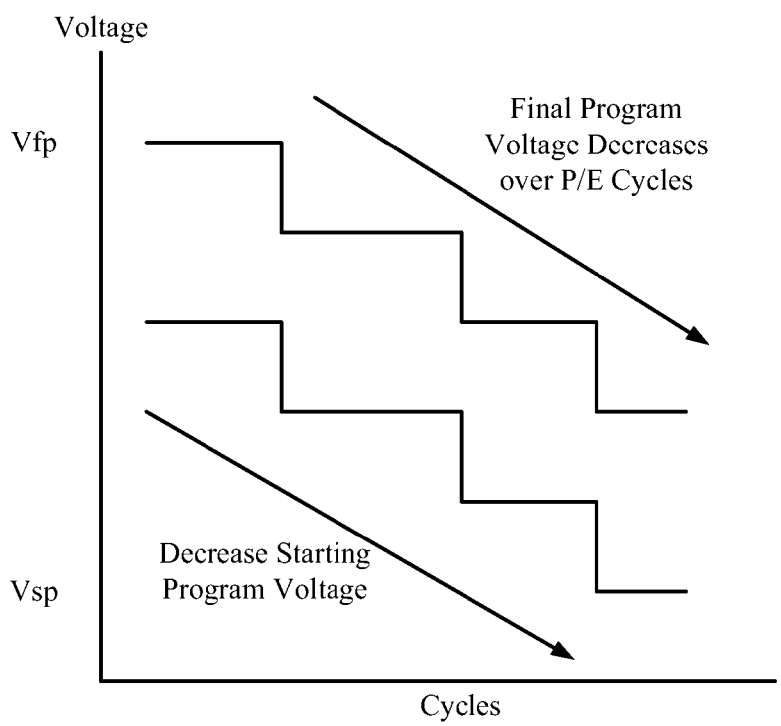

Referring to FIG. 5, in some examples the controller 142 modifies the starting program voltage applied during a program operation progressively as the number of program/erase cycles executed on the nonvolatile memory increases. Thus, in an initial condition the nonvolatile media is configured to have a start program voltage (Vsp). In operation, the controller 142 monitors the P/E cycle count executed on the nonvolatile memory 150 and leaves the start program voltage (Vsp) constant until the cycle count reaches a first threshold T1 (e.g., 1000 cycles), whereupon the controller 142 begins a process of incrementally modifying the start program voltage (Vsp) as the P/E cycle count hits successive thresholds (e.g., T2, T3). In some examples the final program voltage (Vfp) and the start program voltage (Vsp) are decreased contemporaneously so as to maintain a substantially constant difference between the final program voltage (Vfp) and the start program voltage (Vsp).

While the preceding examples have focused on dynamic management of program and erase voltages, one skilled in the art will recognize that additional parameters may be managed dynamically as a function of degradation in the nonvolatile memory 150. For example, some nonvolatile memory uses a true erase-verify (TEV) voltage that is applied on a write line (WL) during an erase-verify sequence, which determines what the erase verify voltage is to be. In such examples, the true erase-verify voltage (TEV) may be modified as a function of P/E cycles or other performance parameters as described above.

In other examples the timing of erase pulses may be modified as a function of P/E cycles or other performance parameters as described above. For example, the timing of a single erase pulse (TE) is typically around 500 microseconds. Increasing the TE provides more time to move electrons in the nonvolatile memory which allows a smaller electric field (erase-voltage), which has benefits to endurance of the nonvolatile memory. However, as the nonvolatile memory nears the end-of-life in terms of P/E cycles, the nonvolatile memory reaches a point sometimes called erase-saturation beyond which the cell cannot be erased. This erase-saturation point moves further out in the P/E cycle count if the TE is shorter. Thus, in some examples the controller 142 may start with a smaller electric field (i.e., longer TE) to obtain the endurance benefit, but once we get close to the erase-saturation, switch to a shorter TE to increase life some more.

In other examples the controller 142 may modify a seeding voltage for the nonvolatile memory or a select gate voltage for the nonvolatile memory as a function of P/E cycles or other performance parameters as described above.

Figure 6:
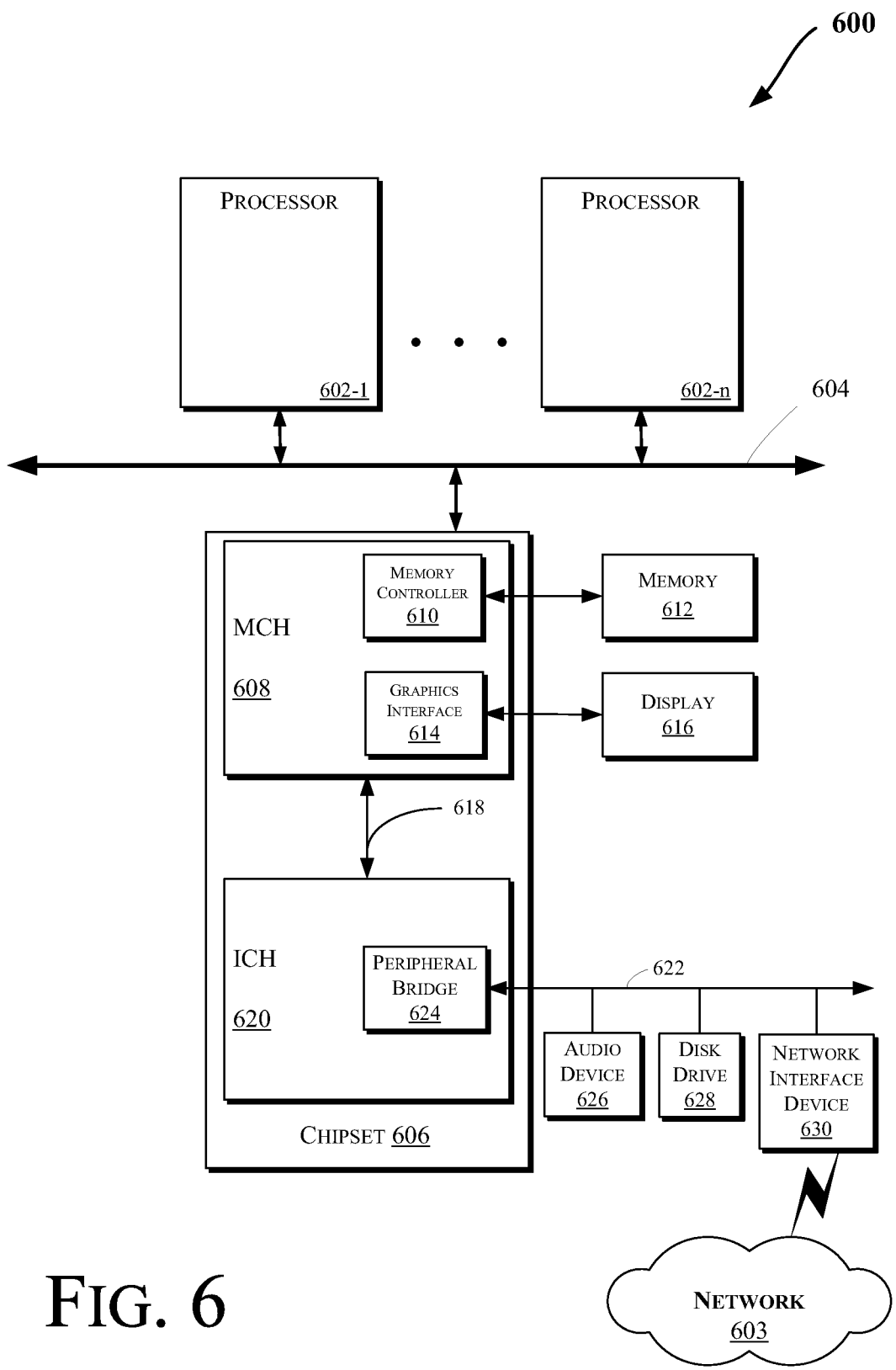
FIGS. 6-10 are schematic, block diagram illustrations of electronic devices which may be adapted to implement dynamic memory management in nonvolatile memory devices in accordance with various examples discussed herein.

As described above, in some examples the electronic device may be embodied as a computer system. FIG. 6 illustrates a block diagram of a computing system 600 in accordance with an example. The computing system 600 may include one or more central processing unit(s) (CPUs) 602 or processors that communicate via an interconnection network (or bus) 604. The processors 602 may include a general purpose processor, a network processor (that processes data communicated over a computer network 603), or other types of a processor (including a reduced instruction set computer (RISC) processor or a complex instruction set computer (CISC)). Moreover, the processors 602 may have a single or multiple core design. The processors 602 with a multiple core design may integrate different types of processor cores on the same integrated circuit (IC) die. Also, the processors 602 with a multiple core design may be implemented as symmetrical or asymmetrical multiprocessors. In an example, one or more of the processors 602 may be the same or similar to the processors 102 of FIG. 1. For example, one or more of the processors 602 may include the control unit 120 discussed with reference to FIGS. 1-3. Also, the operations discussed with reference to FIGS. 3-5 may be performed by one or more components of the system 600.

A chipset 606 may also communicate with the interconnection network 604. The chipset 606 may include a memory control hub (MCH) 608. The MCH 608 may include a memory controller 610 that communicates with a memory 612 (which may be the same or similar to the memory 130 of FIG. 1). The memory 412 may store data, including sequences of instructions, that may be executed by the CPU 602, or any other device included in the computing system 600. In one example, the memory 612 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The MCH 608 may also include a graphics interface 614 that communicates with a display device 616. In one example, the graphics interface 614 may communicate with the display device 616 via an accelerated graphics port (AGP). In an example, the display 616 (such as a flat panel display) may communicate with the graphics interface 614 through, for example, a signal converter that translates a digital representation of an image stored in a storage device such as video memory or system memory into display signals that are interpreted and displayed by the display 616. The display signals produced by the display device may pass through various control devices before being interpreted by and subsequently displayed on the display 616.

A hub interface 618 may allow the MCH 608 and an input/output control hub (ICH) 620 to communicate. The ICH 620 may provide an interface to I/O device(s) that communicate with the computing system 600. The ICH 620 may communicate with a bus 622 through a peripheral bridge (or controller) 624, such as a peripheral component interconnect (PCI) bridge, a universal serial bus (USB) controller, or other types of peripheral bridges or controllers. The bridge 624 may provide a data path between the CPU 602 and peripheral devices. Other types of topologies may be utilized. Also, multiple buses may communicate with the ICH 620, e.g., through multiple bridges or controllers. Moreover, other peripherals in communication with the ICH 620 may include, in various examples, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 622 may communicate with an audio device 626, one or more disk drive(s) 628, and a network interface device 630 (which is in communication with the computer network 603). Other devices may communicate via the bus 622. Also, various components (such as the network interface device 630) may communicate with the MCH 608 in some examples. In addition, the processor 602 and one or more other components discussed herein may be combined to form a single chip (e.g., to provide a System on Chip (SOC)). Furthermore, the graphics accelerator 616 may be included within the MCH 608 in other examples.

Furthermore, the computing system 600 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 7:
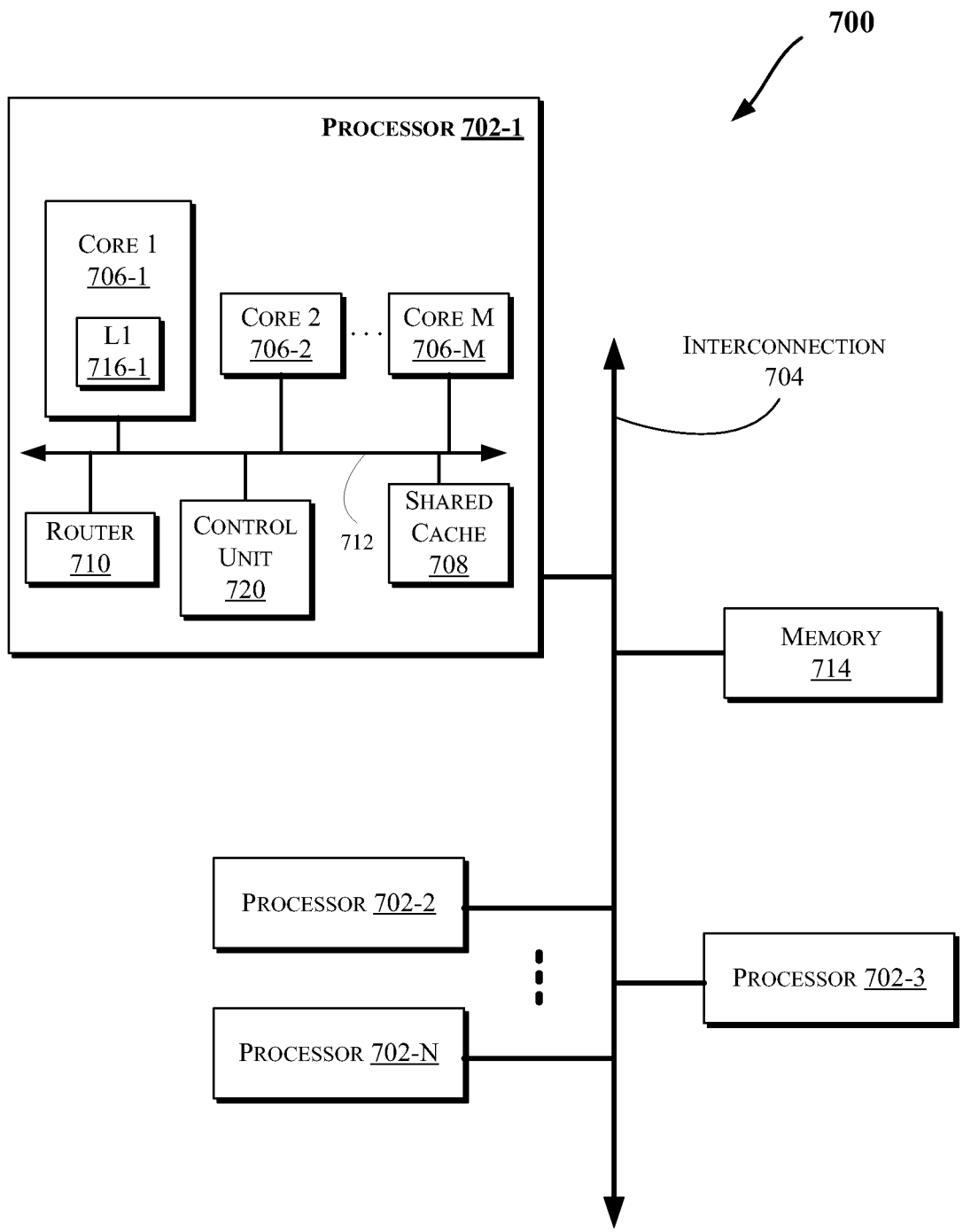

FIG. 7 illustrates a block diagram of a computing system 700, according to an example. The system 700 may include one or more processors 702-1 through 702-N (generally referred to herein as "processors 702" or "processor 702"). The processors 702 may communicate via an interconnection network or bus 704. Each processor may include various components some of which are only discussed with reference to processor 702-1 for clarity. Accordingly, each of the remaining processors 702-2 through 702-N may include the same or similar components discussed with reference to the processor 702-1.

In an example, the processor 702-1 may include one or more processor cores 706-1 through 706-M (referred to herein as "cores 706" or more generally as "core 706"), a shared cache 708, a router 710, and/or a processor control logic or unit 720. The processor cores 706 may be implemented on a single integrated circuit (IC) chip. Moreover, the chip may include one or more shared and/or private caches (such as cache 708), buses or interconnections (such as a bus or interconnection network 712), memory controllers, or other components.

In one example, the router 710 may be used to communicate between various components of the processor 702-1 and/or system 700. Moreover, the processor 702-1 may include more than one router 710. Furthermore, the multitude of routers 710 may be in communication to enable data routing between various components inside or outside of the processor 702-1.

The shared cache 708 may store data (e.g., including instructions) that are utilized by one or more components of the processor 702-1, such as the cores 706. For example, the shared cache 708 may locally cache data stored in a memory 714 for faster access by components of the processor 702. In an example, the cache 708 may include a mid-level cache (such as a level 2 (L2), a level 3 (L3), a level 4 (L4), or other levels of cache), a last level cache (LLC), and/or combinations thereof. Moreover, various components of the processor 702-1 may communicate with the shared cache 708 directly, through a bus (e.g., the bus 712), and/or a memory controller or hub. As shown in FIG. 7, in some examples, one or more of the cores 706 may include a level 1 (L1) cache 716-1 (generally referred to herein as "L1 cache 716"). In one example, the control unit 720 may include logic to implement the operations described above with reference to the memory controller 122 in FIG. 2.

Figure 8:
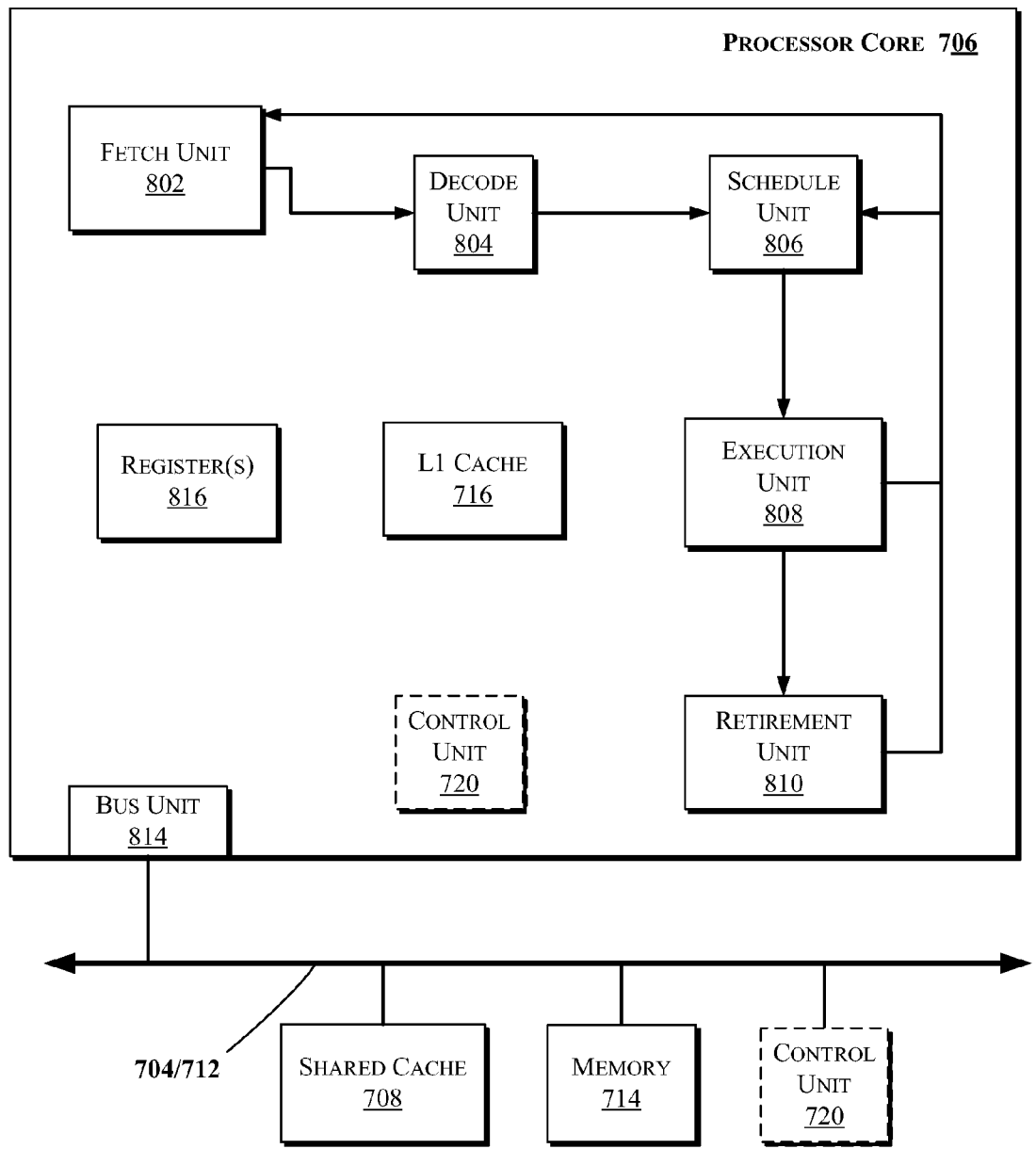

FIG. 8 illustrates a block diagram of portions of a processor core 706 and other components of a computing system, according to an example. In one example, the arrows shown in FIG. 8 illustrate the flow direction of instructions through the core 706. One or more processor cores (such as the processor core 706) may be implemented on a single integrated circuit chip (or die) such as discussed with reference to FIG. 7. Moreover, the chip may include one or more shared and/or private caches (e.g., cache 708 of FIG. 7), interconnections (e.g., interconnections 704 and/or 112 of FIG. 7), control units, memory controllers, or other components.

As illustrated in FIG. 8, the processor core 706 may include a fetch unit 802 to fetch instructions (including instructions with conditional branches) for execution by the core 706. The instructions may be fetched from any storage devices such as the memory 714. The core 706 may also include a decode unit 804 to decode the fetched instruction. For instance, the decode unit 804 may decode the fetched instruction into a plurality of uops (micro-operations).

Additionally, the core 706 may include a schedule unit 806. The schedule unit 806 may perform various operations associated with storing decoded instructions (e.g., received from the decode unit 804) until the instructions are ready for dispatch, e.g., until all source values of a decoded instruction become available. In one example, the schedule unit 806 may schedule and/or issue (or dispatch) decoded instructions to an execution unit 808 for execution. The execution unit 808 may execute the dispatched instructions after they are decoded (e.g., by the decode unit 804) and dispatched (e.g., by the schedule unit 806). In an example, the execution unit 808 may include more than one execution unit. The execution unit 808 may also perform various arithmetic operations such as addition, subtraction, multiplication, and/or division, and may include one or more an arithmetic logic units (ALUs). In an example, a co-processor (not shown) may perform various arithmetic operations in conjunction with the execution unit 808.

Further, the execution unit 808 may execute instructions out-of-order. Hence, the processor core 706 may be an out-of-order processor core in one example. The core 706 may also include a retirement unit 810. The retirement unit 810 may retire executed instructions after they are committed. In an example, retirement of the executed instructions may result in processor state being committed from the execution of the instructions, physical registers used by the instructions being de-allocated, etc.

The core 706 may also include a bus unit 714 to enable communication between components of the processor core 706 and other components (such as the components discussed with reference to FIG. 8) via one or more buses (e.g., buses 804 and/or 812). The core 706 may also include one or more registers 816 to store data accessed by various components of the core 706 (such as values related to power consumption state settings).

Furthermore, even though FIG. 7 illustrates the control unit 720 to be coupled to the core 706 via interconnect 812, in various examples the control unit 720 may be located elsewhere such as inside the core 706, coupled to the core via bus 704, etc.

Figure 9:
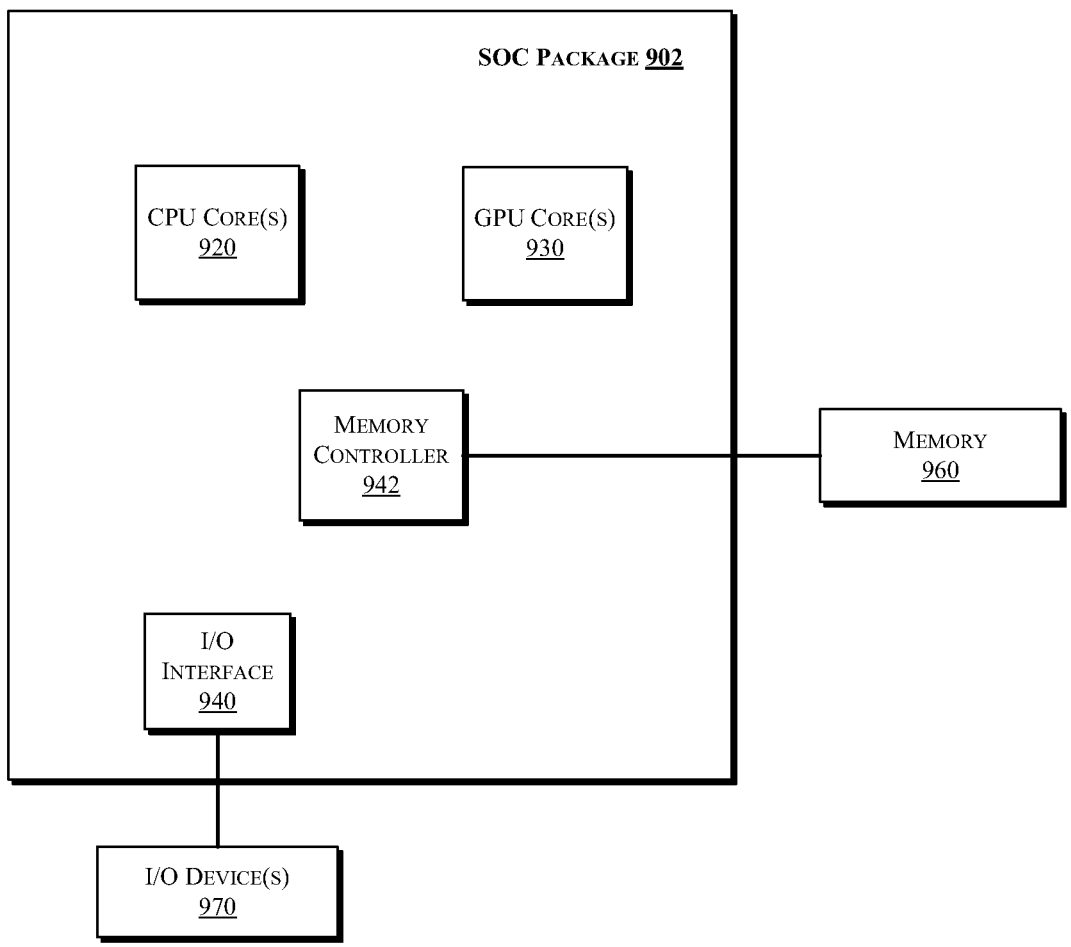

In some examples, one or more of the components discussed herein can be embodied as a System On Chip (SOC) device. FIG. 9 illustrates a block diagram of an SOC package in accordance with an example. As illustrated in FIG. 9, SOC 902 includes one or more Central Processing Unit (CPU) cores 920, one or more Graphics Processor Unit (GPU) cores 930, an Input/Output (I/O) interface 940, and a memory controller 942. Various components of the SOC package 902 may be coupled to an interconnect or bus such as discussed herein with reference to the other figures. Also, the SOC package 902 may include more or less components, such as those discussed herein with reference to the other figures. Further, each component of the SOC package 902 may include one or more other components, e.g., as discussed with reference to the other figures herein. In one example, SOC package 902 (and its components) is provided on one or more Integrated Circuit (IC) die, e.g., which are packaged into a single semiconductor device.

As illustrated in FIG. 9, SOC package 902 is coupled to a memory 960 (which may be similar to or the same as memory discussed herein with reference to the other figures) via the memory controller 942. In an example, the memory 960 (or a portion of it) can be integrated on the SOC package 902.

The I/O interface 940 may be coupled to one or more I/O devices 970, e.g., via an interconnect and/or bus such as discussed herein with reference to other figures. I/O device(s) 970 may include one or more of a keyboard, a mouse, a touchpad, a display, an image/video capture device (such as a camera or camcorder/video recorder), a touch screen, a speaker, or the like.

Figure 10:
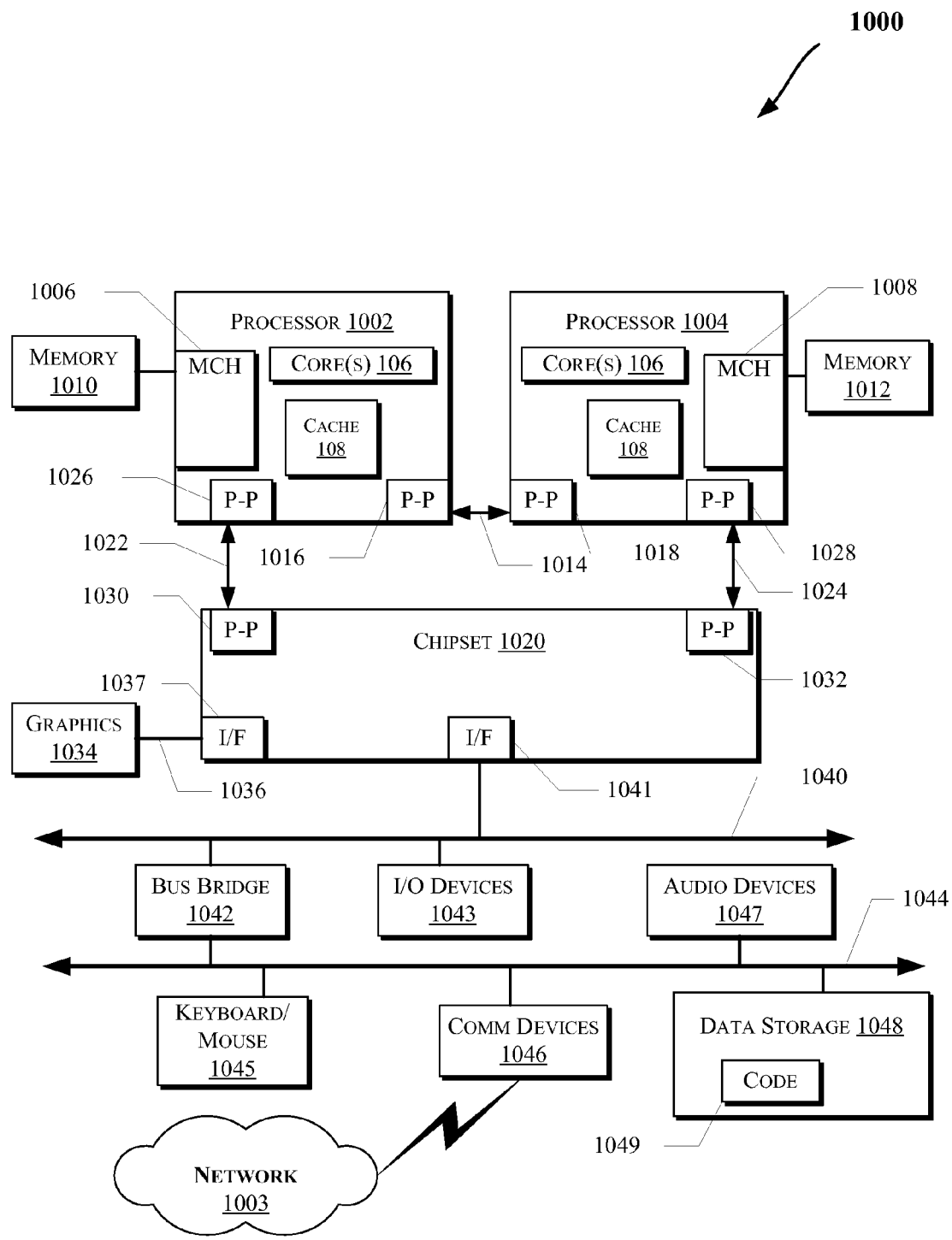

FIG. 10 illustrates a computing system 1000 that is arranged in a point-to-point (PtP) configuration, according to an example. In particular, FIG. 10 shows a system where processors, memory, and input/output devices are interconnected by a number of point-to-point interfaces. The operations discussed with reference to FIG. 2 may be performed by one or more components of the system 1000.

As illustrated in FIG. 10, the system 1000 may include several processors, of which only two, processors 1002 and 1004 are shown for clarity. The processors 1002 and 1004 may each include a local memory controller hub (MCH) 1006 and 1008 to enable communication with memories 1010 and 1012. MCH 1006 and 1008 may include the memory controller 120 and/or logic of FIG. 1 in some examples.

In an example, the processors 1002 and 1004 may be one of the processors 702 discussed with reference to FIG. 7. The processors 1002 and 1004 may exchange data via a point-to-point (PtP) interface 1014 using PtP interface circuits 1016 and 1018, respectively. Also, the processors 1002 and 1004 may each exchange data with a chipset 1020 via individual PtP interfaces 1022 and 1024 using point-to-point interface circuits 1026, 1028, 1030, and 1032. The chipset 1020 may further exchange data with a high-performance graphics circuit 1034 via a high-performance graphics interface 1036, e.g., using a PtP interface circuit 1037.

As shown in FIG. 10, one or more of the cores 106 and/or cache 108 of FIG. 1 may be located within the processors 1002 and 1004. Other examples, however, may exist in other circuits, logic units, or devices within the system 1000 of FIG. 10. Furthermore, other examples may be distributed throughout several circuits, logic units, or devices illustrated in FIG. 10.

The chipset 1020 may communicate with a bus 1040 using a point-to-point PtP interface circuit 1041. The bus 1040 may have one or more devices that communicate with it, such as a bus bridge 1042 and I/O devices 1043. Via a bus 1044, the bus bridge 1043 may communicate with other devices such as a keyboard/mouse 1045, communication devices 1046 (such as modems, network interface devices, or other communication devices that may communicate with the computer network 803), audio I/O device, and/or a data storage device 1048. The data storage device 1048 (which may be a hard disk drive or a NAND flash based solid state drive) may store code 1049 that may be executed by the processors 1002 and/or 1004.

The following pertains to further examples.

Example 1 is an electronic device comprising at least one processor, at least one storage device comprising a nonvolatile memory, and a controller coupled to the memory and comprising logic to monitor at least one performance parameter of a nonvolatile memory, determine when the at least one performance parameter passes a threshold which indicates a degradation in performance for the nonvolatile memory, and in response to the at least one performance parameter passing the threshold, to modify at least one operational attribute of the nonvolatile memory.

In Example 2, the subject matter of Example 1 can optionally include an arrangement in which the at least one performance parameter comprises at least one of a number of program/erase cycles executed on the nonvolatile memory, a write time parameter for executing write operations on the nonvolatile memory or a read failure parameter for read operations on the nonvolatile memory.

In Example 3, the subject matter of any one of Examples 1-2 can optionally include an arrangement in which logic to modify at least one operational attribute of the nonvolatile memory further comprises logic to increase an erase voltage threshold for the nonvolatile memory.

In Example 4, the subject matter of any one of Examples 1-3 can optionally include logic to an arrangement in which the logic to modify at least one operational attribute of the nonvolatile memory further comprises logic to increase a program voltage threshold for the nonvolatile memory.

In Example 5, the subject matter of any one of Examples 1-4 can optionally include an arrangement in which the logic to modify at least one operational attribute of the nonvolatile memory further comprises logic to increase an erase start voltage for the nonvolatile memory.

In Example 6, the subject matter of any one of Examples 1-5 can optionally include an arrangement in which the logic to modify at least one operational attribute of the nonvolatile memory further comprises logic to increase a program start voltage for the nonvolatile memory.

In Example 7, the subject matter of any one of Examples 1-6 can optionally include an arrangement in which the logic to modify at least one operational attribute of the nonvolatile memory further comprises logic to modify at least one of a seeding voltage for the nonvolatile memory, a true-erase voltage (TEV), an erase pulse timing (TE), a select gate voltage.

Example 8 is a storage device, comprising a nonvolatile memory; and a controller coupled to the memory and comprising logic to monitor at least one performance parameter of a nonvolatile memory, determine when the at least one performance parameter passes a threshold which indicates a degradation in performance for the nonvolatile memory and in response to the at least one performance parameter passing the threshold, to modify at least one operational attribute of the nonvolatile memory.

In Example 9, the subject matter of Example 8 can optionally include an arrangement in which the the at least one performance parameter comprises at least one of a number of program/erase cycles executed on the nonvolatile memory, a write time parameter for executing write operations on the nonvolatile memory or a read failure parameter for read operations on the nonvolatile memory.

In Example 10, the subject matter of any one of Examples 8-9 can optionally include an arrangement in which logic to modify at least one operational attribute of the nonvolatile memory further comprises logic to increase an erase voltage threshold for the nonvolatile memory.

In Example 11, the subject matter of any one of Examples 8-10 can optionally include logic to an arrangement in which the logic to modify at least one operational attribute of the nonvolatile memory further comprises logic to increase a program voltage threshold for the nonvolatile memory.

In Example 12, the subject matter of any one of Examples 8-11 can optionally include an arrangement in which the logic to modify at least one operational attribute of the nonvolatile memory further comprises logic to increase an erase start voltage for the nonvolatile memory.

In Example 13, the subject matter of any one of Examples 8-12 can optionally include an arrangement in which the logic to modify at least one operational attribute of the nonvolatile memory further comprises logic to increase a program start voltage for the nonvolatile memory.

In Example 14, the subject matter of any one of Examples 8-13 can optionally include an arrangement in which the logic to modify at least one operational attribute of the nonvolatile memory further comprises logic to modify at least one of a seeding voltage for the nonvolatile memory, a true-erase voltage (TEV), an erase pulse timing (TE), a select gate voltage.

Example 15 is a controller comprising logic, at least partially including hardware logic, to monitor at least one performance parameter of a nonvolatile memory, determine when the at least one performance parameter passes a threshold which indicates a degradation in performance for the nonvolatile memory and in response to the at least one performance parameter passing the threshold, to modify at least one operational attribute of the nonvolatile memory.

In Example 16, the subject matter of Example 15 can optionally include an arrangement in which the at least one performance parameter comprises at least one of a number of program/erase cycles executed on the nonvolatile memory, a write time parameter for executing write operations on the nonvolatile memory or a read failure parameter for read operations on the nonvolatile memory.

In Example 17, the subject matter of any one of Examples 15-16 can optionally include an arrangement in which logic to modify at least one operational attribute of the nonvolatile memory further comprises logic to increase an erase voltage threshold for the nonvolatile memory.

In Example 18, the subject matter of any one of Examples 15-17 can optionally include logic to an arrangement in which the logic to modify at least one operational attribute of the nonvolatile memory further comprises logic to increase a program voltage threshold for the nonvolatile memory.

In Example 19, the subject matter of any one of Examples 15-18 can optionally include an arrangement in which the logic to modify at least one operational attribute of the nonvolatile memory further comprises logic to increase an erase start voltage for the nonvolatile memory.

In Example 20, the subject matter of any one of Examples 15-19 can optionally include an arrangement in which the logic to modify at least one operational attribute of the nonvolatile memory further comprises logic to increase a program start voltage for the nonvolatile memory.

In Example 21, the subject matter of any one of Examples 15-20 can optionally include an arrangement in which the logic to modify at least one operational attribute of the nonvolatile memory further comprises logic to modify at least one of a seeding voltage for the nonvolatile memory, a true-erase voltage (TEV), an erase pulse timing (TE), a select gate voltage.

In various examples, the operations discussed herein, e.g., with reference to FIGS. 1-10, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed herein.

Reference in the specification to "one example" or "an example" means that a particular feature, structure, or characteristic described in connection with the example may be included in at least an implementation. The appearances of the phrase "in one example" in various places in the specification may or may not be all referring to the same example.

Also, in the description and claims, the terms "coupled" and "connected," along with their derivatives, may be used. In some examples, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although examples have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An electronic device, comprising:
   at least one processor; and
   at least one storage device comprising a nonvolatile memory; and
   a controller coupled to the memory and comprising logic to:
      monitor at least one performance parameter of a nonvolatile memory;
      determine when the at least one performance parameter passes a threshold which indicates a degradation in performance for the nonvolatile memory; and
      in response to the at least one performance parameter passing the threshold, to modify at least one operational attribute of the nonvolatile memory selected from the group consisting of increasing an erase voltage threshold for the nonvolatile memory, increasing a program voltage threshold for the nonvolatile memory, increasing an erase start voltage for the nonvolatile memory, increasing a program start voltage for the nonvolatile memory, modify a seeding voltage for the nonvolatile memory, modifying a true-erase voltage (TEV), modifying an erase pulse timing (TE), and modifying a select gate voltage.

2. The electronic device of claim 1, wherein the at least one performance parameter comprises at least one of:
   a number of program/erase cycles executed on the nonvolatile memory;
   a write time parameter for executing write operations on the nonvolatile memory; or
   a read failure parameter for read operations on the nonvolatile memory.

3. The electronic device of claim 2, wherein the logic to modify at least one operational attribute of the nonvolatile memory further comprises logic to increase an erase voltage threshold for the nonvolatile memory.

4. The electronic device of claim 2, wherein the logic to modify at least one operational attribute of the nonvolatile memory further comprises logic to increase a program voltage threshold for the nonvolatile memory.

5. The electronic device of claim 2, wherein the logic to modify at least one operational attribute of the nonvolatile memory further comprises logic to increase an erase start voltage for the nonvolatile memory.

6. The electronic device of claim 2, wherein the logic to modify at least one operational attribute of the nonvolatile memory further comprises logic to increase a program start voltage for the nonvolatile memory.

7. The electronic device of claim 2, wherein the logic to modify at least one operational attribute of the nonvolatile memory further comprises logic to modify at least one of:
   a seeding voltage for the nonvolatile memory;
   a true-erase voltage (TEV);
   an erase pulse timing (TE); or
   a select gate voltage.

8. A storage device, comprising:
   a nonvolatile memory; and
   a controller coupled to the memory and comprising logic to:
      monitor at least one performance parameter of a nonvolatile memory;
      determine when the at least one performance parameter passes a threshold which indicates a degradation in performance for the nonvolatile memory; and in response to the at least one performance parameter passing the threshold, to modify at least one operational attribute of the nonvolatile memory selected from the group consisting of increasing an erase voltage threshold for the nonvolatile memory, increasing a program voltage threshold for the nonvolatile memory, increasing an erase start voltage for the nonvolatile memory, increasing a program start voltage for the nonvolatile memory, modify a seeding voltage for the nonvolatile memory, modifying a true-erase voltage (TEV), modifying an erase pulse timing (TE), and modifying a select gate voltage.

9. The storage device of claim 8, wherein the at least one performance parameter comprises at least one of:
a number of program/erase cycles executed on the nonvolatile memory;
a write time parameter for executing write operations on the nonvolatile memory; or
a read failure parameter for read operations on the nonvolatile memory.

10. The storage device of claim 9, wherein the logic to modify at least one operational attribute of the nonvolatile memory further comprises logic to increase an erase voltage threshold for the nonvolatile memory.

11. The storage device of claim 9, wherein the logic to modify at least one operational attribute of the nonvolatile memory further comprises logic to increase a program voltage threshold for the nonvolatile memory.

12. The storage device of claim 9, wherein the logic to modify at least one operational attribute of the nonvolatile memory further comprises logic to increase an erase start voltage threshold for the nonvolatile memory.

13. The storage device of claim 9, wherein the logic to modify at least one operational attribute of the nonvolatile memory further comprises logic to increase a program start voltage threshold for the nonvolatile memory.

14. The storage device of claim 9, wherein the logic to modify at least one operational attribute of the nonvolatile memory further comprises logic to modify at least one of:
a seeding voltage for the nonvolatile memory device;
a true-erase voltage (TEV);
an erase pulse timing (TE); or
a select gate voltage.

15. A controller comprising logic, at least partially including hardware logic, to:
monitor at least one performance parameter of a nonvolatile memory;
determine when the at least one performance parameter passes a threshold which indicates a degradation in performance for the nonvolatile memory; and
in response to the at least one performance parameter passing the threshold, to modify at least one operational attribute of the nonvolatile memory selected from the group consisting of increasing an erase voltage threshold for the nonvolatile memory, increasing a program voltage threshold for the nonvolatile memory, increasing an erase start voltage for the nonvolatile memory, increasing a program start voltage for the nonvolatile memory, modify a seeding voltage for the nonvolatile memory, modifying a true-erase voltage (TEV), modifying an erase pulse timing (TE), and modifying a select gate voltage.

16. The controller of claim 15, wherein the at least one performance parameter comprises at least one of:
a number of program/erase cycles executed on the nonvolatile memory;
a write time parameter for executing write operations on the nonvolatile memory; or
a read failure parameter for read operations on the nonvolatile memory.

17. The controller of claim 16, wherein the logic to modify at least one operational attribute of the nonvolatile memory further comprises logic to increase an erase voltage threshold for the nonvolatile memory.

18. The controller of claim 16, wherein the logic to modify at least one operational attribute of the nonvolatile memory further comprises logic to increase a program voltage threshold for the nonvolatile memory.

19. The controller of claim 16, wherein the logic to modify at least one operational attribute of the nonvolatile memory further comprises logic to increase an erase start voltage for the nonvolatile memory.

20. The controller of claim 16, wherein the logic to modify at least one operational attribute of the nonvolatile memory further comprises logic to increase a program start voltage for the nonvolatile memory.

21. The controller of claim 16, wherein the logic to modify at least one operational attribute of the nonvolatile memory further comprises logic to modify at least one of:
a seeding voltage for the nonvolatile memory device;
a true-erase voltage (TEV);
an erase pulse timing (TE); or
a select gate voltage.

* * * * *